United States Patent [19]

Nichols et al.

[11] Patent Number: 4,992,392
[45] Date of Patent: Feb. 12, 1991

[54] METHOD OF MAKING A VIRTUAL PHASE CCD

[75] Inventors: David N. Nichols, Fairport; Constantine Anagnostopoulos, Mendon; Charles V. Stancampiano, Rochester, all of N.Y.

[73] Assignee: Eastman Kodak Company, Rochester, N.Y.

[21] Appl. No.: 458,871

[22] Filed: Dec. 28, 1989

[51] Int. Cl.$^5$ .......................................... H01L 21/339
[52] U.S. Cl. ...................................... 437/53; 437/27; 437/28; 437/30; 437/931
[58] Field of Search ....................... 437/53, 27, 28, 30, 437/931; 357/24

[56] References Cited

U.S. PATENT DOCUMENTS

| | | | |
|---|---|---|---|
| 3,853,634 | 12/1974 | Amelio et al. | 148/1.5 |
| 3,918,997 | 11/1975 | Mohsen et al. | 148/1.5 |
| 4,047,215 | 9/1977 | Frye et al. | 357/24 |
| 4,076,557 | 2/1978 | Huang et al. | 437/28 |
| 4,171,229 | 10/1979 | Simi et al. | 148/1.5 |
| 4,229,752 | 10/1980 | Hynecek | 357/24 |
| 4,613,402 | 9/1986 | Losee et al. | 156/643 |
| 4,732,868 | 3/1988 | Nichols | 437/53 |
| 4,746,622 | 5/1988 | Hawkins et al. | 437/53 |

Primary Examiner—Brian E. Hearn
Assistant Examiner—Chandra Chaudhari
Attorney, Agent, or Firm—Raymond L. Owens

[57] ABSTRACT

A virtual phase CCD is fabricated in a semiconductor substrate of n-type conductivity having a layer of silicon dioxide on a surface by first forming a channel region by the implantation of boron ions. Masking regions of polycrystalline silicon are then formed on the silicon dioxide over and spaced along the channel region. Boron ions are then implanted into the substrate between the masking regions. The size of the masking regions are then increased by the addition of portions of a first photoresist layer to decrease the spacing along the channel region between the masking regions. Arsenic ions are then implanted into the channel region between the masking regions to form virtual gate regions along the surface of the channel reigon. Boron ions are then implanted into the substrate between the masking regions. The size of the masking regions is then further increased by the addition of a second photoresist layer to further decrease the spacing between the masking regions along the channel region. Boron ions are then implanted into the substrate between the masking regions. The masking regions and the silicon dioxide layer are removed and conductive gates are formed over and insulated from the substrate surface between the virtual gate regions.

23 Claims, 9 Drawing Sheets

_4,992,392_

METHOD OF MAKING A VIRTUAL PHASE CCD

FIELD OF THE INVENTION

The present invention relates to a method of making a virtual phase charge-coupled device (CCD) and more particularly, to such a method in which all of the regions are formed by ion implantation using a minimum of steps and masking layers.

BACKGROUND OF THE INVENTION

Solid-state image sensors include a plurality of photodetectors, such as photodiodes, arranged in either a line array or a rectangular array of rows and columns. A shift register extends along the line or each column of photodetectors to carry the collected charge carriers to an output circuit. Charge-coupled devices (CCD's) are a preferred form of shift register used in these image sensors. CCD's, in general, include a channel region along which the charge carriers travel and gates over the channel region for moving the charge carriers along the channel.

One type of CCD is a virtual phase CCD. This type of CCD can include a plurality of gates spaced along the channel and electrically connected together to operate in unison. Between each pair of adjacent gates and within the channel region are regions of different doping levels to form potential wells of various depths increasing from one gate to the next along the path of the channel region. Along the surface of the channel region between the gates is a virtual gate which fixes the potential level of the portions of the channel region between the gates. The virtual gate is a high conductivity region along the surface of the channel region.

One such virtual gate CCD is shown in U.S. Pat. No. 4,229,752 to J. Hynecek, issued Oct. 21, 1980, entitled "Virtual Phase Charge Transfer Device". This patent also describes several methods of making such a virtual phase CCD. One of the methods described in the Hynecek patent requires a diffusion from an oxide layer. However, this is unsatisfactory since the inward diffusion is difficult to control and some of the dopant remains in the oxide layer where it is not needed. A more serious drawback of this method is that the dopant tends to excessively diffuse at the very edge of an electrode of the CCD both downwardly and laterally outwardly, which caused unwanted alterations of the potential well of adjacent regions being formed. A second method described in the Hynecek patent has the drawback that it can result in a device which is susceptible to transfer inefficiency and image smear as a result of particulate masking of some of the ion implantations used to form the CCD. If particles fall on the substrate just before the second acceptor implantation, potential wells can be formed in the gated storage region which may trap charge. Furthermore, this second method requires a masking layer to be etched twice which can adversely effect the underlying layers unless very stringent selective etching is used. Thus, the methods of the Hynecek patent require a number of steps which must be tightly controlled or undesirable modifications to the CCD being formed can result.

SUMMARY OF THE INVENTION

The present invention is directed to a method of making a virtual phase CCD wherein a buried channel, virtual gates, storage regions and barrier regions are all formed by ion implantation steps. In addition, initial mask regions are formed of polycrystalline silicon and are enlarged by portions of photoresist so as to limit the number of steps required to make the CCD. More specifically, the method of the present invention comprises the steps of forming in a substrate of a semiconductor material of one conductivity type a channel region of the opposite conductivity type which extends along a surface of the substrate. A plurality of first masking regions are formed over the substrate surface spaced along the channel region. Ions of a conductivity modifier of a second conductivity type are then implanted into the substrate between the first masking regions to increase the impurity concentration of portions of the channel region receiving the implantation. The size of the first masking regions is increased, such as with photoresist, so that the spacing between adjacent masking regions along the channel region is decreased. Ions of a conductivity modifier of the one conductivity type are then implanted into the substrate between the enlarged masking regions to form virtual gate regions along the surface of the channel region between each pair of masking regions. Ions of a conductivity modifier of the second conductivity type are also implanted into the substrate between the enlarged masking regions to further increase the impurity concentration of portions of the channel region below the virtual gate regions. The size of the masking regions are then further increased, such as with a photoresist, to further reduce the spacing between the masking regions along the channel region. Ions of a conductivity modifier of the second conductivity type are implanted into the substrate between the further enlarged masking regions to still further increase the impurity concentration of portions of the channel region below the virtual gate regions. The masking regions are then removed and conductive gates are formed over and insulated from the substrate surface along the channel region and between the virtual gates.

The invention will be better understood from the following more detailed description taken with the accompanying drawings and claims.

It should be understood that the drawings are not

DETAIL DESCRIPTION

Figure 1:
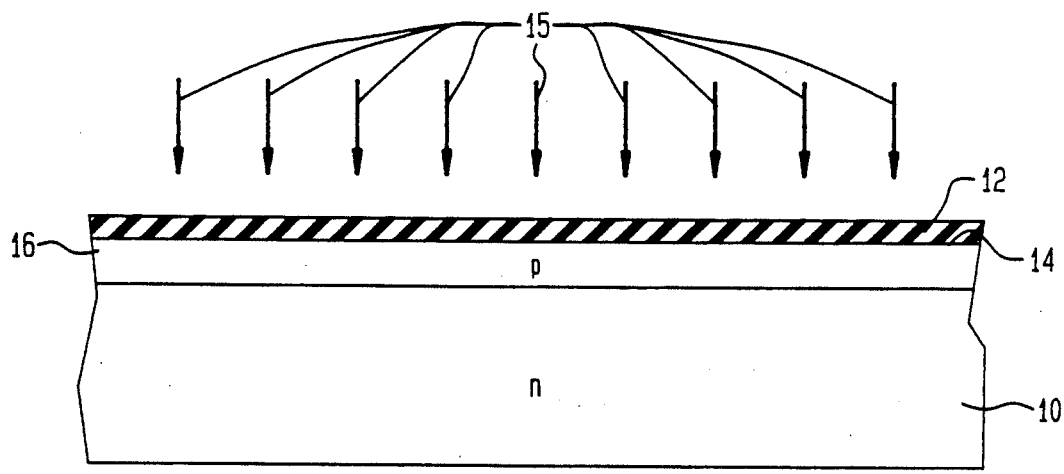
FIGS. 1 through 7 are sectional views of a virtual phase CCD illustrating the steps of a first method in accordance with the present invention for making the CCD.

A first method of the present invention for making a virtual phase CCD starts with a semiconductor body (substrate) 10 of single crystalline silicon having a layer 12 of silicon dioxide on a surface 14 thereof as shown in FIG. 1. In an illustrative embodiment the substrate 10 is of n-type conductivity and having an impurity concentration of $2 \times 10^{14}$ impurities/cm$^3$ and the silicon oxide layer 12 is preferably of a thickness of about 800 Angstroms. The silicon oxide layer 12 may be formed on the substrate 10 by heating the substrate 10 in an oxygen containing atmosphere at a temperature of about 1000° C. to oxidize the surface 12 of the substrate 10. Although not shown, channel stops may be formed in the substrate 12 as shown in U.S. Pat. No. 4,229,752.

Ions, as indicated by arrows 15, of a conductivity modifier of p-type conductivity, such as boron ions, are then implanted into the substrate 10 through the silicon dioxide layer 12 to form within a portion of substrate 10 a p-type conductivity channel region 16 which extends to the surface 14. The boron ions may be implanted at a dosage of $4.7 \times 10^{11}$ atoms/cm$^2$ and an energy of 110 keV. To define the area where the ions are implanted, a masking layer (not shown), such as of a photoresist, is applied on the silicon dioxide layer 12. The photoresist layer is defined, using standard photolithographic techniques, to create an opening therethrough over the area of the substrate surface 14 where the channel region 16 is to be formed. During subsequent processing, channel region 16 is selectively doped with impurities which increase the impurity concentration in the portions receiving such doping such that region 16 comprises portions which have the original impurity concentration of the region 16, and portions 16a, 16b and 16c (all shown in FIG. 7) which each have greater impurity concentration than the previously mentioned portion of region 16. Portions 16c have a higher impurity concentration than portions 16b which have a higher impurity concentration than portions 16a.

Figure 2:
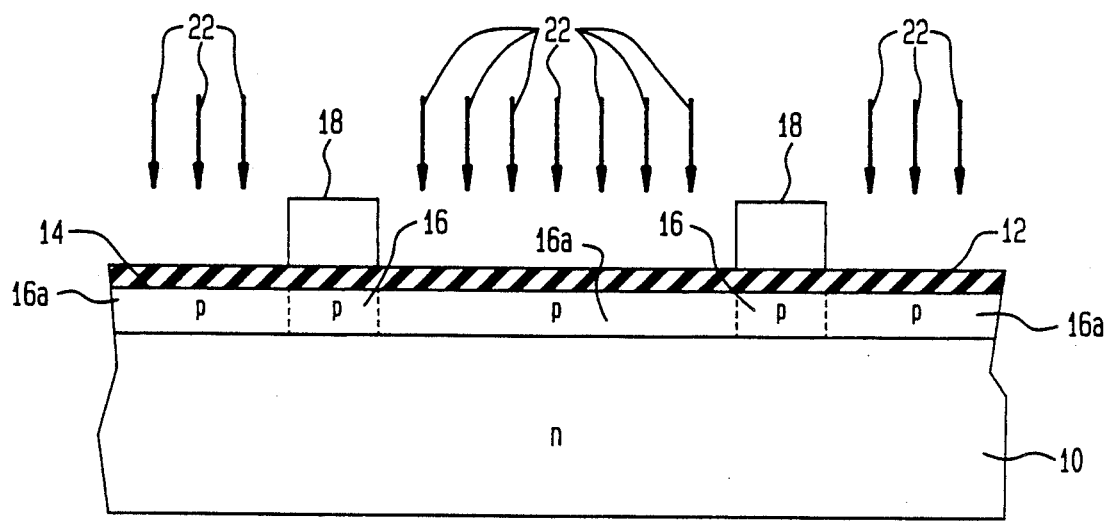

As is shown in FIG. 2, a layer of polycrystalline silicon is then deposited over the silicon dioxide layer 12 and is defined to form a plurality of masking regions 18 extending across and spaced along the channel region 16. The polycrystalline silicon layer may be deposited by a chemical vapor deposition technique wherein the silicon dioxide layer 12 is exposed to a gas containing silicon, such as silane, and heated to a temperature, about 620° C., at which the gas decomposes and deposits the silicon on the silicon dioxide layer 12. The polycrystalline silicon layer is typically defined by applying a masking layer, such as a photoresist, over the polycrystalline silicon layer and defining the photoresist, using standard photolithographic techniques, so that it covers only the areas of the polycrystalline silicon layer that are to form masking regions 18. The uncovered area of the polycrystalline silicon layer is then removed, such as with a suitable etchant, leaving the masking regions 18. The masking regions 18 cover what is to become the transfer region 16 (the portion 16 of channel region 16 which has the same impurity concentration as did original channel region 16-see FIG. 7) of a clocked phase portion of the CCD.

As is shown in FIG. 2, ions, as is indicated by arrows 22, of a conductivity modifier of p-type conductivity, such as boron, are then implanted into the substrate 10 between the masking regions 18. This causes portions 16a of channel region 16 to be increased in impurity concentration above that of the rest of channel region 16. In an illustrative embodiment, the implantation is achieved at a dosage of $6.7 \times 10^{11}$ atoms/cm$^2$ and an energy of 110 keV.

Figure 3:
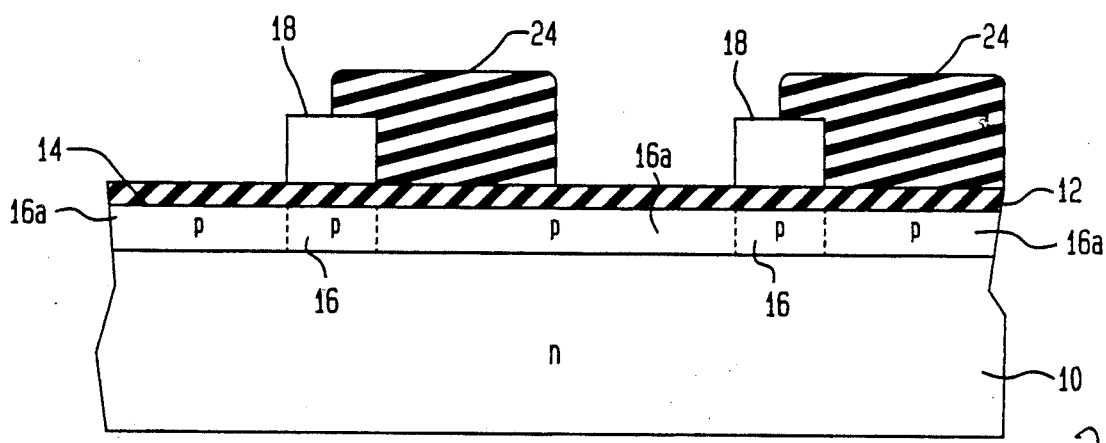

As shown in FIG. 3, the size of each of the masking regions 18 is then increased to decrease the spacing between the masking regions 18 along the channel region 16. This is achieved by applying a layer of a photoresist 24 over the masking regions 18 and the exposed area of the silicon dioxide layer 12 and defining the photoresist layer 24, using standard photolithographic techniques. The photoresist layer 24 is defined so that portions thereof overlap one side of each polycrystalline silicon masking region 18 and extend over the silicon dioxide layer 12. It insures that the masking region 18 and photoresist portion 24 cover what is to become the clocked phase region under a gate 38 (see FIG. 7) of the CCD being fabricated.

Figure 4:
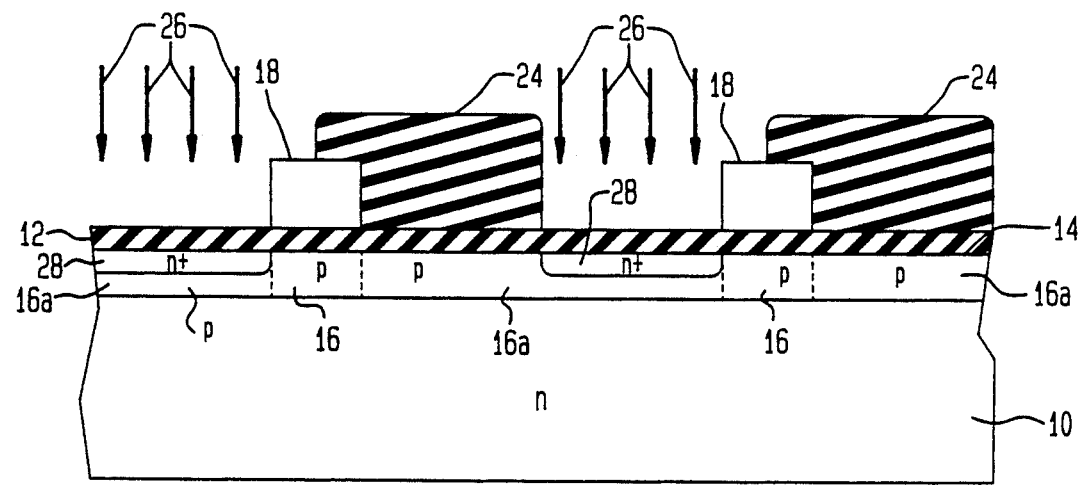

As shown in FIG. 4, a shallow implant of ions (e.g., arsenic ions), as indicated by the arrows 26, of an n-type conductivity is performed to form n+ type virtual gate regions 28 (shown as n+). The arsenic implant is carried out at a dosage of $1.4 \times 10^{13}$ atoms/cm$^2$ at an energy of 200 keV. The virtual gate regions 28 are a high conductivity region along the surface 14 of the substrate 10.

Figure 5:
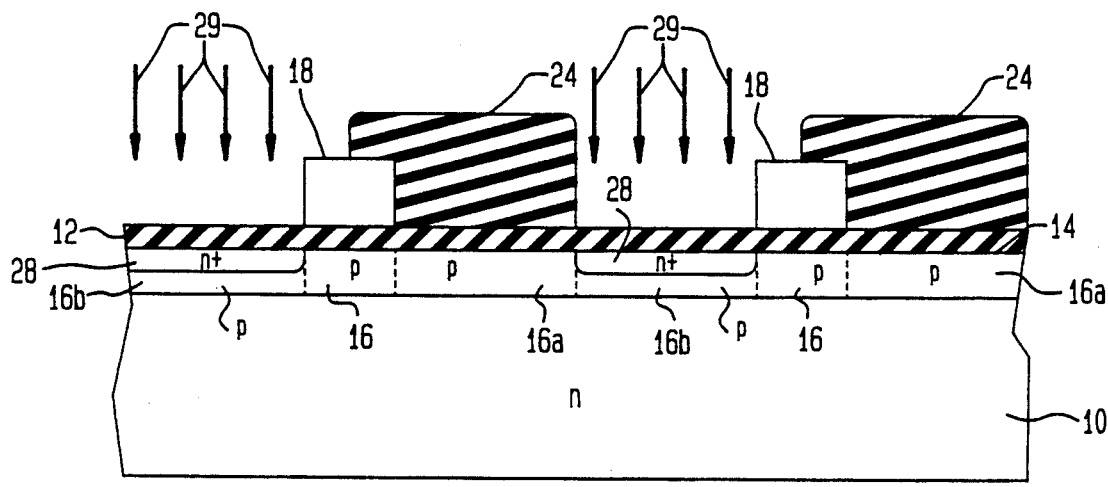

As shown in FIG. 5, ions, as indicated by the arrows 29, of a conductivity modifier of p-type conductivity, such as boron, are then implanted into the substrate 10 through the exposed areas of the silicon dioxide layer 12 to form portions 16b of channel region 16 which have a higher impurity concentration than portions 16a which have a higher concentration than portions 16. The boron implant is carried out at a dosage of $1.6 \times 10^{12}$ atoms/cm$^2$ at an energy of 110 keV.

Figure 6:
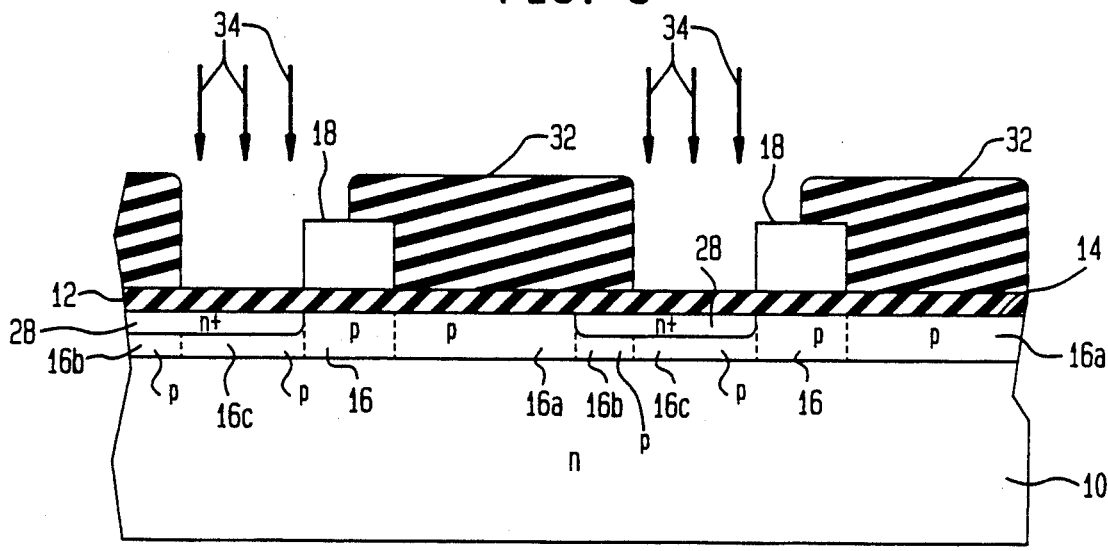

As shown in FIG. 6, the photoresist portions 24 are then removed with a suitable solvent and the masking regions 18 are again enlarged to further decrease the spacing between the masking regions 18. This is achieved by applying a layer of a photoresist 32 over the masking regions 18 and portions of the exposed area of the silicon dioxide layer 14. The photoresist layer 32 is defined, using standard photolithographic techniques, to form portions thereof which overlap one side of each of the masking regions 18 and cover a storage region (portion 16a) under the to be formed gate 38 (see FIG. 7) and a barrier region (portion 16b) under each virtual gate region 28 as is shown in FIG. 6.

Ions, as indicated by the arrows 34, of a conductivity modifier of p-type conductivity, such as boron, are then implanted into the substrate 10 through the exposed areas of the silicon dioxide layer 14 as is shown in FIG. 6 to form portions 16c of channel region 16 which have a higher impurity concentration than portions 16b. Portions 16c establish the channel potential of a storage region under the virtual gate region 28. The ions are preferably implanted at a dosage of $1.75 \times 10^{12}$ atoms/cm$^2$ at an energy of 110 keV.

The photoresist portions 32 are then removed with a suitable solvent. The polycrystalline silicon masking regions 18 and the silicon dioxide layer 12 are then removed with a suitable etchant. The polycrystalline silicon masking regions 18 can be removed using an SF$_6$ containing plasma etching process and the silicon dioxide layer 12 can be removed using buffered HF.

Figure 7:
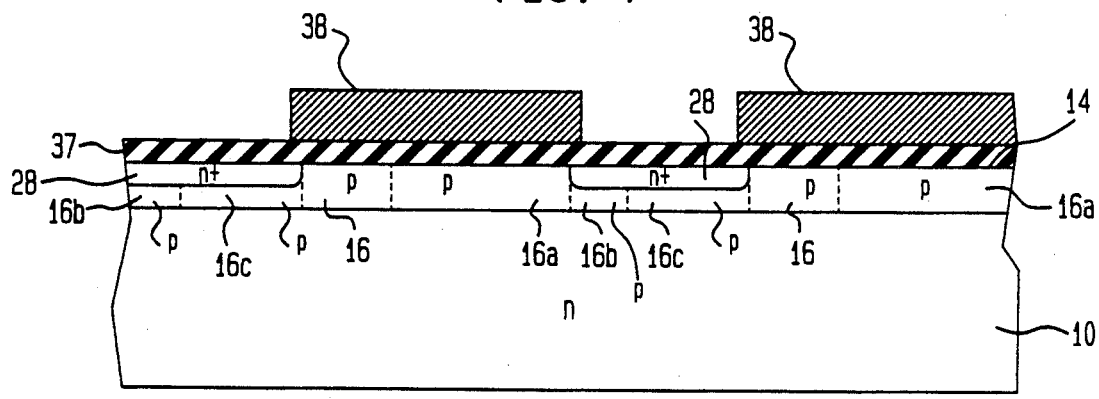

As shown in FIG. 7, a gate silicon dioxide layer 37 is then grown on the substrate surface 14, such as by heating the substrate in an oxidizing atmosphere at a temperature of about 950° C. The gate oxide layer 37 is preferably about 1000 Angstroms thick. A layer of polycrystalline silicon is then deposited over the gate oxide layer 37 and is defined to form conductive gates 38. The conductive gates 38 are then doped with phosphorus and extend across the portions of the channel region 16 and overlap portions of the virtual gates 28. It is only necessary that gates 38 extend up to virtual gates 28. To insure that this occurs in a non-self aligned process, it is desirable to overlap the two. During operation of the CCD, gates 38 are pulsed positive and negative to cause charge carriers to transfer (shift) from under a virtual gate region 28 to under a gate 38

Figure 8:
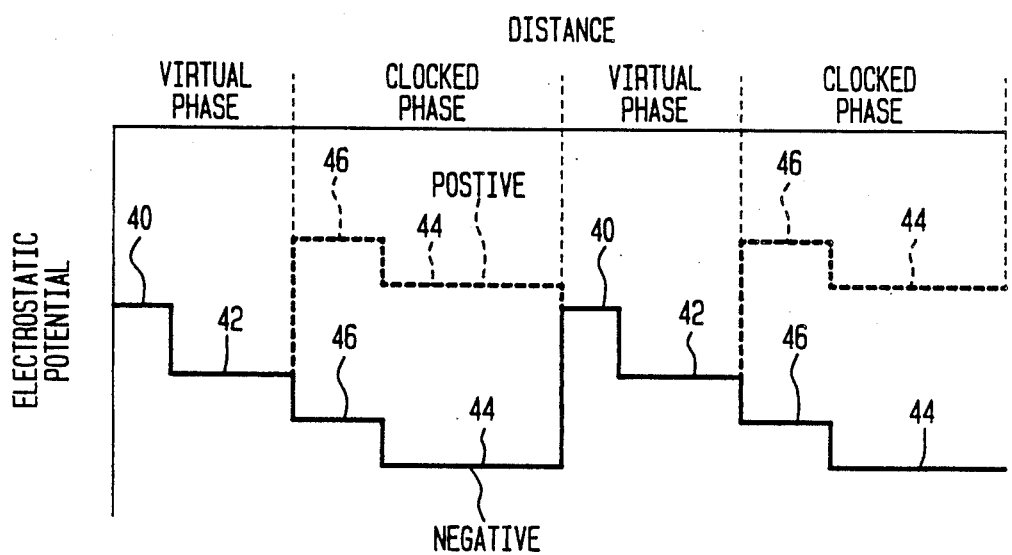
FIG. 8 is a graphical diagram showing electrostatic potential versus distance during the operation of a CCD made by all the methods of the present invention.

Referring to FIG. 8, there is graphically shown the electrostatic potentials of portions of the CCD of FIG. 7 during operation thereof starting from the left hand side of FIG. 7. The operation of the CCD is made up of a virtual phase which occurs under virtual gate regions 28 and a clocked phase which occurs under gates 38. The potentials in the virtual phases of the CCD are fixed by the virtual gate regions 28. The virtual phase of operation includes a voltage barrier (potential) 40 adjacent one edge of each of the clocked gates 38 and a first storage region having a potential 42 associated therewith between each voltage barrier 40 and the next clocked gate 38. Regions 16b correspond to voltage barrier 40. Regions 16c correspond to first storage regions under virtual gate regions 28. The potential 42 in the first storage regions is lower than the potential 40. Each gate 38 has a second storage region thereunder having a potential 44 and a potential barrier having a potential 46. The second storage regions having the potential 44 comprise regions 16a. The regions corresponding to voltage barrier level 46 are regions 16 of FIG. 7 under gate 38. These regions do not include regions 16a, 16b and 16c. The potential level 44 is always lower than that in the potential level 46 as a result of the implantation of region 16a.

When the gates 38 are clocked with a negative voltage, the potentials 44 in the second storage regions and the barrier potentials 46 are lower than the potential 42 in an adjacent first storage region. This condition is indicated by the solid lines for potentials 44 and 46 and the word "NEGATIVE". This allows charge carriers to be transferred into the second storage regions from adjacent photodetectors (not shown) or from first storage regions. The charge carriers are held in the second storage regions until the gates 38 are clocked with a positive voltage. This raises the potentials 44 in the second storage regions and the barrier potentials 46 (as indicated by the dash lines and the word "POSITIVE") until the potentials 44 in the second storage regions are higher than the potentials 40 in the potential barriers under the virtual gate regions 28. This allows the charge carriers in the second storage regions under the gates 38 to flow over the potential barriers 40 and into the first storage regions. Since the barrier potential 46 is always at a potential higher than the potential 44 in the second storage region, the charge carriers can only flow in one direction along the channel region 16.

When the gates 38 are clocked with a negative voltage again, the potential 44 of the second storage regions and the potential 46 of the gate 38 barrier regions drop back down again to a level below the potentials 42 in the virtual gate storage regions. This allows charge carriers stored in the virtual gate storage regions to flow over the barrier regions of the solid line potential 46 and into the gate 38 storage regions of the next clocked gate 38. Thus, by clocking the gates 38 alternately with a negative and positive voltage, the charge carriers are moved along the channel region 16 to one end of the CCD where the charge carriers are transferred to a read-out circuit (not shown).

Figure 9:
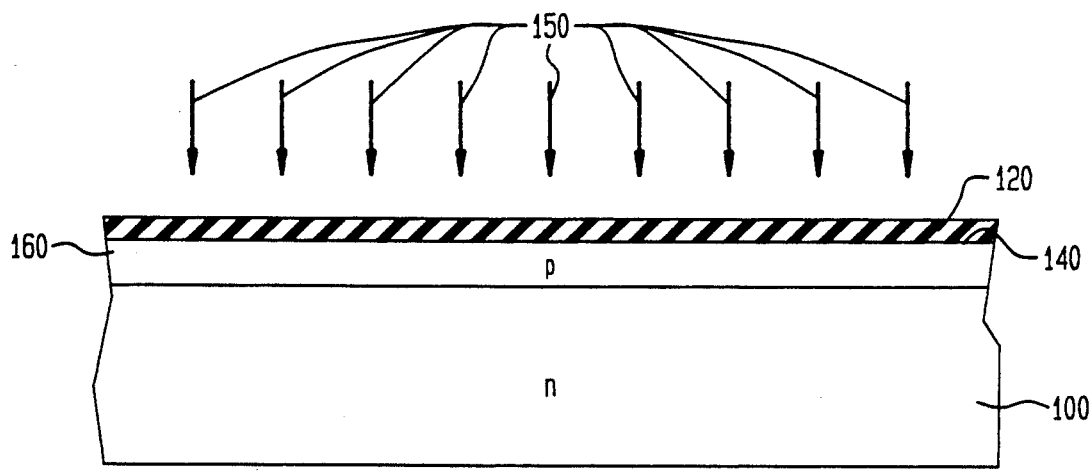
FIGS. 9 through 15 are sectional views of a virtual phase CCD illustrating the steps of a second method in accordance with the present invention for making the CCD.

A second method of the present invention for making a virtual phase CCD starts with a semiconductor body (substrate) 100 of single crystalline silicon having a layer 120 of silicon dioxide on a surface 140 thereof as shown in FIG. 9. In an illustrative embodiment the substrate 100 is of n-type conductivity and the silicon oxide layer 120 is preferably of a thickness of about 800 Angstroms. The silicon oxide layer 120 may be formed on the substrate 100 by heating the substrate 100 in an oxygen containing atmosphere at a temperature of about 1000° C. to oxidize the surface 140 of the substrate 100. Although not shown, channel stops may be formed in the substrate 100 as shown in U.S. Pat. No. 4,229,752.

Ions, as indicated by arrows 150, of a conductivity modifier of p-type conductivity, such as boron ions, are then implanted into the substrate 100 through the silicon dioxide layer 120 to form within a portion of substrate 100 a p-type conductivity channel region 160 which extends to the surface 140. The boron ions may be implanted at a dosage of $4.7 \times 10^{11}$ atoms/cm$^{-2}$ and an energy of 110 keV. To define the area where the ions are implanted, a masking layer (not shown), such as of a photoresist, is applied on the silicon dioxide layer 120. The photoresist layer is defined, using standard photolithographic techniques, to create an opening therethrough over the area of the silicon dioxide layer 120 where the channel region 160 is to be formed. During subsequent processing, channel region 160 is selectively doped with impurities which increase the impurity concentration in the portions receiving such doping such that region 160 comprises portions 160 which have the original impurity concentration of the region 160, and portions 160a, 160b and 160c (all shown in FIG. 15) which each have greater impurity concentration than the previously mentioned portion of region 160. Portions 160c have a greater impurity concentration than portions 160b which have a greater impurity concentration than portions 160a.

Figure 10:
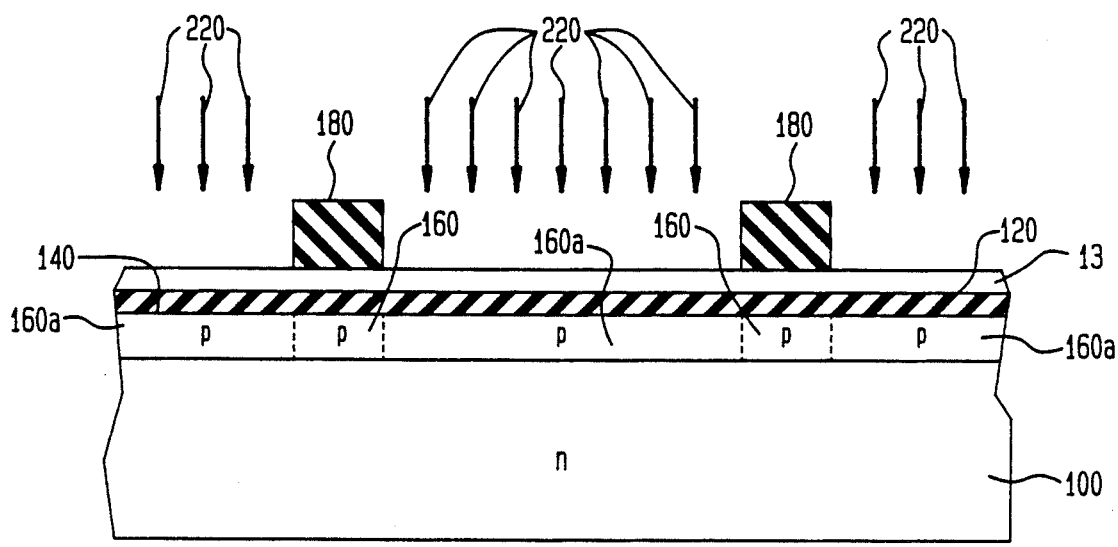

A layer of doped polycrystalline silicon 13 is then deposited over the silicon dioxide layer 120. A second layer of silicon dioxide is then formed over layer 13 and is defined to form a plurality of masking regions 180 extending across and spaced along the channel region 160 as is shown in FIG. 10. The second silicon dioxide layer may be deposited by a chemical vapor deposition technique wherein the polysilicon layer is exposed to a gas containing silicon, such as silane, and to a gas containing oxygen, and heated to a temperature, about 380° C., at which the gases combine to deposit the silicon dioxide on the polysilicon layer. The silicon dioxide layer is typically defined by applying a masking layer, such as a photoresist, over the second silicon dioxide layer and defining the photoresist, using standard photolithographic techniques, so that it covers only the areas of the silicon dioxide layer that are to form masking regions 180. The uncovered area of the silicon dioxide layer is then removed, such as with a suitable etchant, leaving the masking regions 180. The masking regions 180 cover what is to become the transfer region 160 (the portion 160 of channel region 160 which has the same impurity concentration as did original channel region 160—see FIG. 14) of a clocked phase portion of the CCD.

As is shown in FIG. 10, ions, as is indicated by arrows 220, of a conductivity modifier of p-type conductivity, such as boron, are then implanted into the substrate 100 between the masking regions 180. This causes portions 160a of channel region 160 to be increased in impurity concentration above that of the rest of channel region 160.

Figure 11:
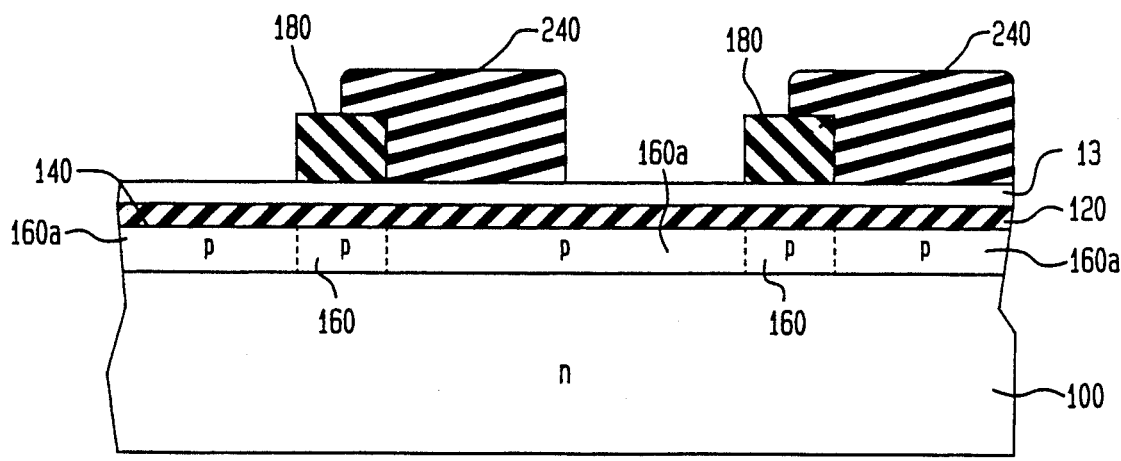

As is shown is in FIG. 11, the size of each of the masking regions 180 is then increased to decrease the spacing between the masking regions 180 along the channel region 160. This is achieved by applying a layer of a photoresist 240 over the masking regions 180 and the exposed area of the polycrystalline layer 13 and defining the photoresist layer 240, using standard photolithographic techniques. The photoresist layer 240 is defined so that portions thereof overlap one side of each silicon dioxide masking region 180 and extend over the polycrystalline layer 13. It insures that the masking region 180 and photoresist portion 240 cover what is to become the clocked phase region under a gate 380 (see FIG. 15) of the CCD being fabricated.

Figure 12:
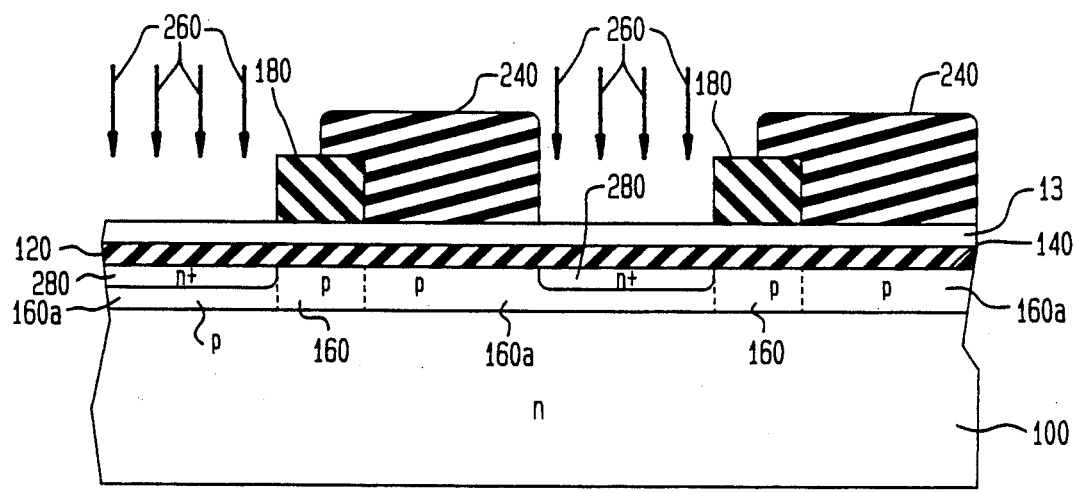

As shown in FIG. 12, a shallow implant of ions (e.g., arsenic ions), as indicated by the arrows 260, of an n-type conductivity is performed to form n+ type virtual gate regions 280 (shown as n+). The virtual gate regions 280 are a high conductivity region along the surface 140 of the substrate 100.

Figure 13:
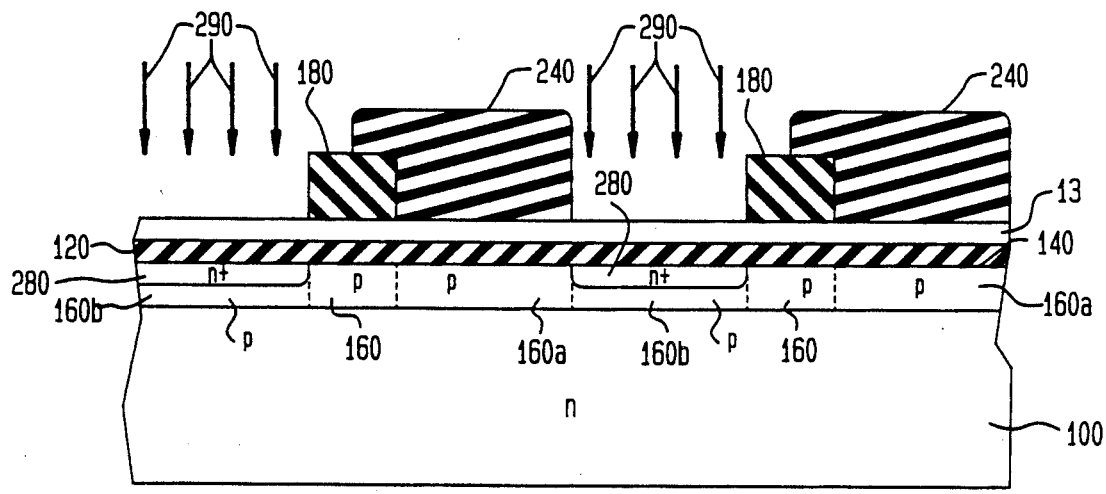

As shown in FIG. 13, ions, as indicated by the arrows 290, of a conductivity modifier of p-type conductivity, such as boron, are then implanted into the substrate 100 through the exposed areas of the polycrystalline silicon layer 13 to form portions 160b of channel region 160 which have a higher impurity concentration than portions 160a which have a higher impurity concentration that portions 160.

The photoresist portions 240 are then removed with a suitable solvent and the masking regions 180 are again enlarged to further decrease the spacing between the masking regions 180. This is achieved by applying a layer of a photoresist 320 over the masking regions 180 and portions of the exposed area of the polycrystalline silicon layer 13. The photoresist layer 320 is defined, using standard photolithographic techniques, to form portions thereof which overlap one side of each of the masking regions 180 and cover a storage region (portion 160a) under the to be formed conductive gate 380 (see FIG. 15) and a barrier region (portion 160b) under each virtual gate region 28 as is shown in FIG. 14.

Figure 14:
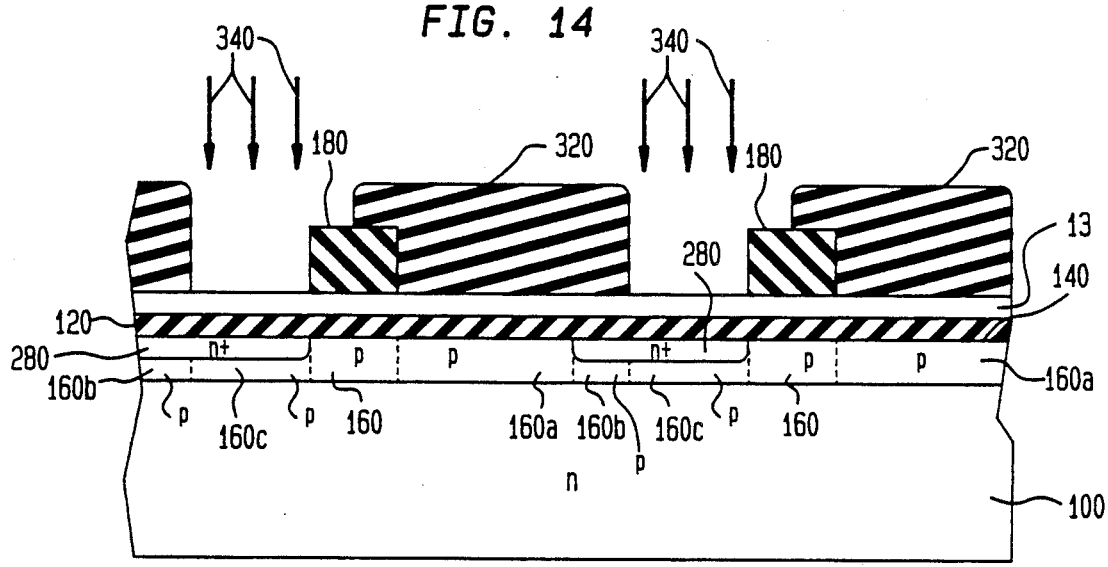

As is shown in FIG. 14, ions, as indicated by the arrows 340, of a conductivity modifier of p-type conductivity, such as boron, are then implanted into the substrate 100 through the exposed areas of the polycrystalline silicon layer 13 to form portions 160c of channel region 160 which have a higher impurity concentration than portions 160b. Portions 160c establish the channel potential of a storage region under the virtual gate region 280.

The photoresist portions 320 are then removed with a suitable solvent. The silicon dioxide masking regions 180 are then removed with a suitable etchant. The silicon dioxide masking regions 180 can be removed using buffered HF.

Figure 15:
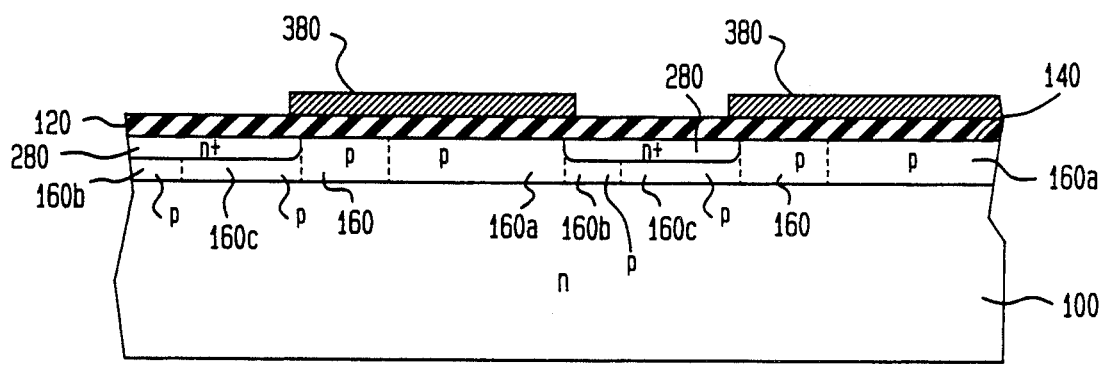

As shown in FIG. 15, the polycrystalline silicon layer is defined to form conductive gates 380 and extend across the portions of the channel region 16 and overlap portions of the virtual gate regions 280. It is only necessary that conductive gates 380 extend up to virtual gate regions 280. To insure that this occurs in a non-self aligned process, it is desirable to overlap the two. During operation of the CCD, conductive gates 380 are pulsed positive and negative to cause charge carriers to transfer (shift) from under a virtual gate region 280 to under a gate 380.

Figure 16:
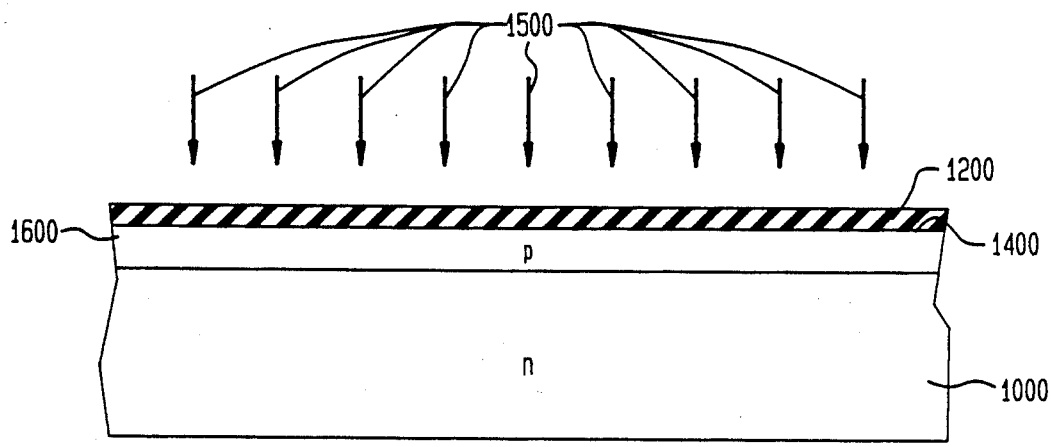
FIGS. 16 through 23 are sectional views of a virtual phase CCD illustrating the steps of a third method in accordance with the present invention for making the CCD.

A third method of the present invention for making a virtual phase CCD starts with a semiconductor body (substrate) 1000 of single crystalline silicon having a layer 1200 of silicon dioxide on a surface 1400 thereof as shown in FIG. 16. The substrate 1000 is of n-type conductivity, with an impurity concentration of $2 \times 10^{14}$ impurities/cm$^3$, and the silicon oxide layer 1200 is preferably of a thickness of about 600 Angstroms. The silicon oxide layer 1200 may be formed on the substrate 1000 by heating the substrate 1000 in an oxygen containing atmosphere at a temperature of about 1000° C. to oxidize the surface 1200 of the substrate 1000. Although not shown, channel stops may be formed in the substrate 12 as shown in U.S. Pat. No. 4,229,752.

Ions, as indicated by arrows 1500, of a conductivity modifier of p-type conductivity, such as boron ions, are then implanted into the substrate 1000 through the silicon dioxide layer 1200 to form within a portion of substrate 1000 a p-type conductivity channel region 1600 which extends to the surface 1400. The boron ions may be implanted at a dosage of $4.7 \times 10^{11}$ atoms/cm$^{-2}$ and an energy of 110 keV. To define the area where the ions are implanted, a masking layer (not shown), such as of a photoresist, is applied on the silicon dioxide layer 1200. The photoresist layer is defined, using standard photolithographic techniques, to create an opening therethrough over the area of the silicon dioxide layer 1200 where the channel region 1600 is to be formed. During subsequent processing, channel region 1600 is selectively doped with impurities which increase the impurity concentration in the portions receiving such doping such that region 1600 becomes laterally doped and comprises a portions 1600 which have the original impurity concentration of the region 1600, and portions 1600a, 1600b and 1600c (all shown in FIG. 23) which each have greater impurity concentration than the previously mentioned portion of region 1600. Portions 1600c have a greater impurity concentration than portions 1600b which have greater impurity concentration than portions 1600a.

Figure 17:
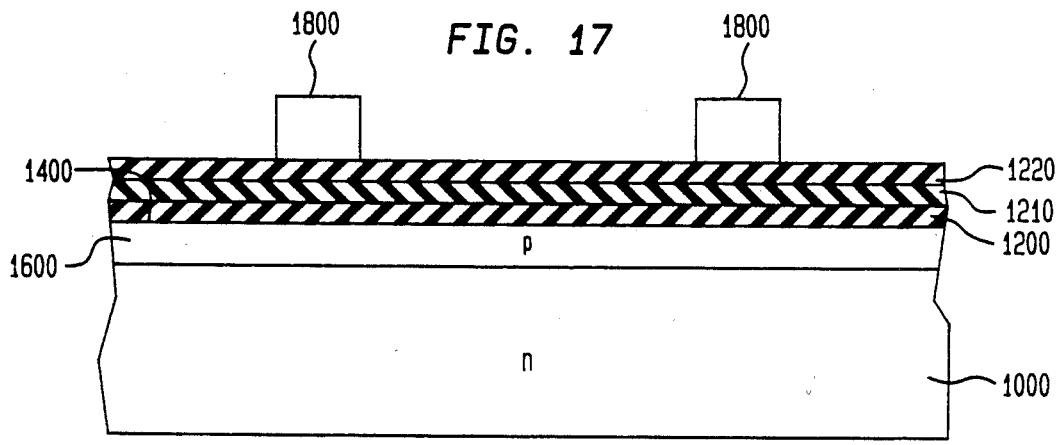

A layer of silicon nitride 1210 is then deposited over the silicon dioxide layer 1200. The silicon nitride layer 1210 may be of a thickness of 250 Angstroms. A layer of CVD deposited silicon dioxide 1220 is the deposited over silicon nitride layer 1210. A polycrystalline silicon layer is then formed over layer 1220 and is defined to form a plurality of masking regions 1800 extending across and spaced along the channel region 1600 as is shown in FIG. 17. The polycrystalline silicon layer may be deposited by a chemical vapor deposition technique wherein the silicon dioxide layer 1220 is exposed to a gas containing silicon, such as silane, and heated to a temperature, about 620° C., at which the gas decomposes and deposits the silicon on the silicon dioxide layer 1220. The polycrystalline silicon layer is typically defined by applying a masking layer, such as a photoresist, over the polycrystalline silicon layer and defining the photoresist, using standard photolithographic techniques, so that it covers only the areas of the polycrystalline silicon layer that are to form masking regions 1800. The uncovered area of the polycrystalline silicon layer is then removed, such as with a suitable etchant, leaving the masking regions 1800. The portions of the silicon dioxide layer 1220 not covered by masking regions 1800 are then removed, such as by the use of buffered HF. The masking regions 1800 cover what is to become the transfer region 1600 (a portion 1600 of channel region 1600 which has the same impurity concentration as did original channel region 1600—see FIG. 23) of a clocked phase portion of the CCD.

Figure 18:
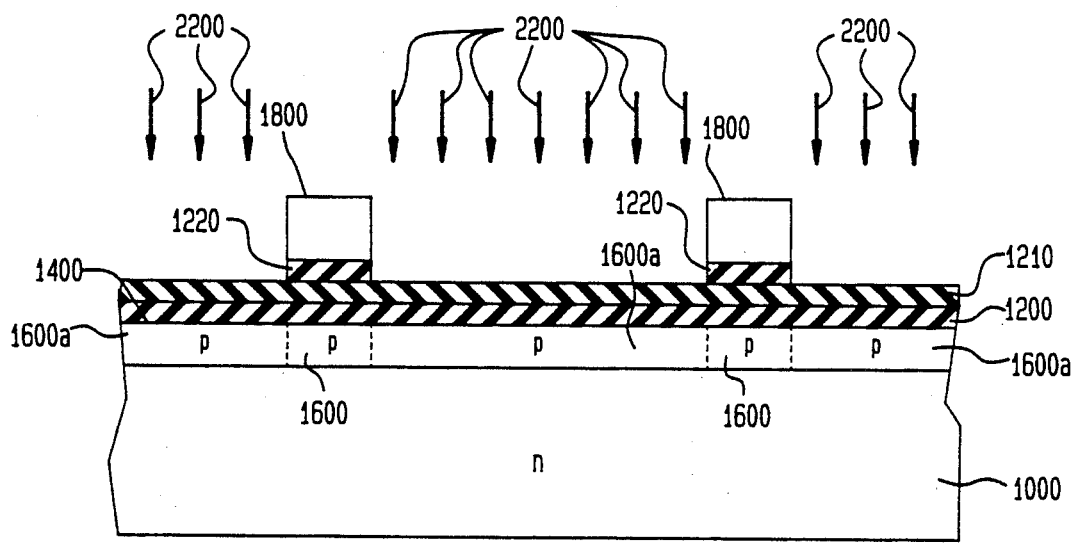

As is shown in FIG. 18, ions, as is indicated by arrows 2200, of a conductivity modifier of p-type conductivity, such as boron, are then implanted into the substrate 1000 between the masking regions 1800 as is shown in FIG. 18. This causes portions 1600a of channel region 1600 to be increased in impurity concentration above that of the rest of channel region 1600. In an illustrative embodiment, the implantation is done at a dosage of $6.7 \times 10^{11}$ impurities/cm$^2$ at an energy of 110 keV.

Figure 19:
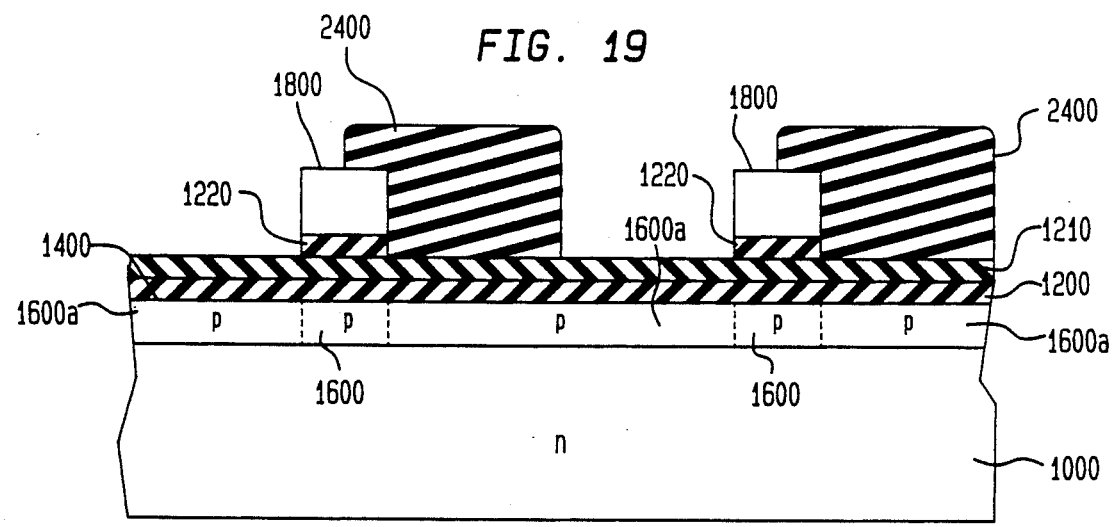

As is shown in FIG. 19, the size of each of the masking regions 1800 is then increased to decrease the spacing between the masking regions 1800 along the channel region 1600. This is achieved by applying a layer of a photoresist 2400 over the masking regions 1800 and the exposed area of the silicon nitride layer 1210 and defining the photoresist layer 2400, using standard photolithographic techniques. The photoresist layer 2400 is defined so that portions thereof overlap one side of each polycrystalline silicon masking region 1800 and extend over portions of the silicon nitride layer 1210. This insures that the masking region 1800 and photoresist portion 2400 cover what is to become the clocked phase region under a conductive gate 3800 (see FIG. 23) of the CCD being fabricated.

Figure 20:
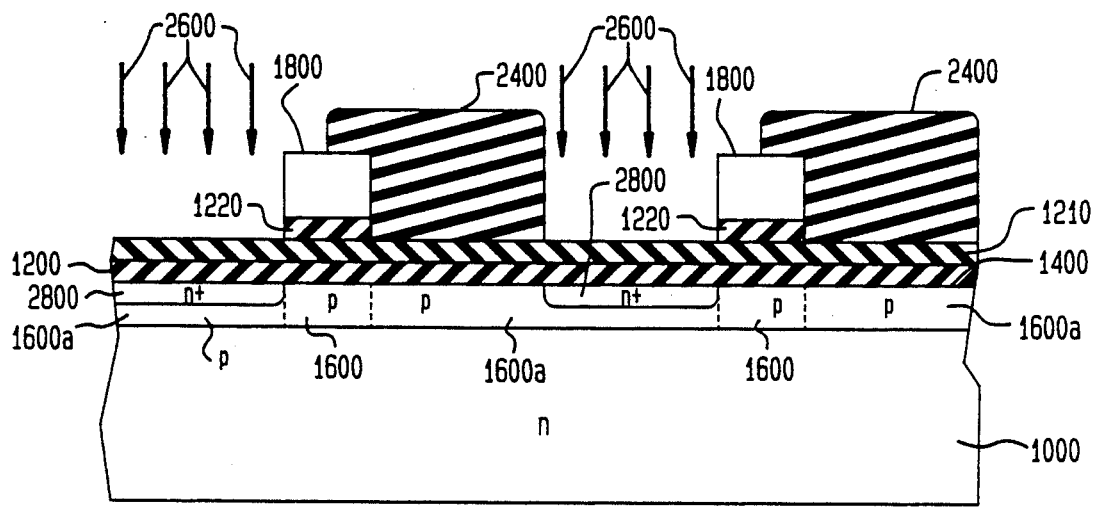

As is shown in FIG. 20, a shallow implant of ions (e.g., arsenic ions), as indicated by the arrows 2600, of an n-type conductivity is performed to form n+ type virtual gate regions 2800 (shown as n+). The implant is carried out at a dosage of $1.4 \times 10^{13}$ atoms/cm$^2$ at an energy of 200 keV. The virtual gate regions 2800 are a high conductivity region along the surface 1400 of the substrate 1000.

Figure 21:
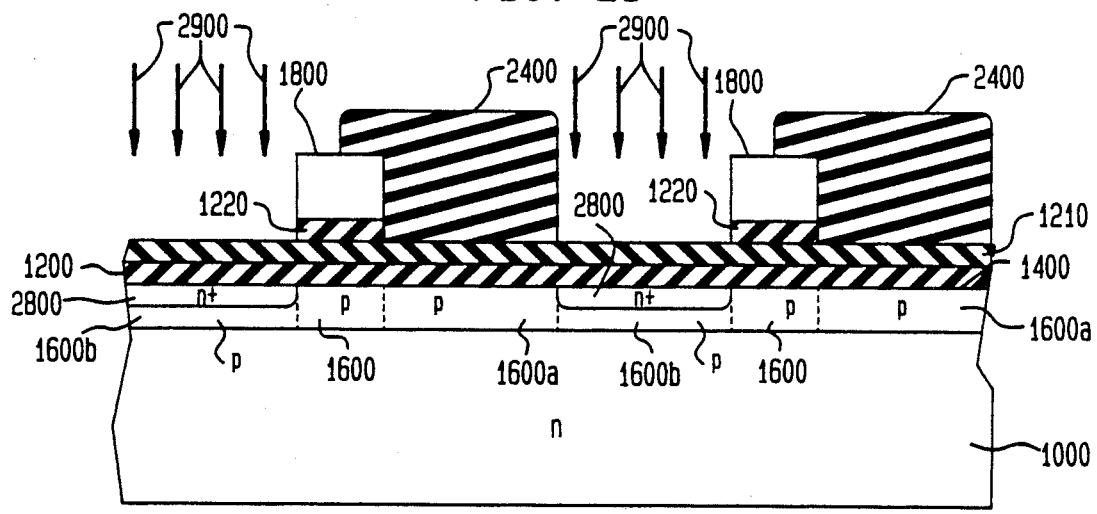

As is shown in FIG. 21, ions, as indicated by the arrows 2900, of a conductivity modifier of p-type conductivity, such as boron, are then implanted into the substrate 1000 through the exposed areas of the silicon nitride layer 1210 to form portions 1600b of channel region 1600 which have a higher impurity concentration than portions 1600a which have a higher impurity concentration than portions 1600. The boron implantation is illustratively done at a dosage of $1.6 \times 10^{12}$ impurities/cm$^2$ at an energy of 110 keV.

Figure 22:
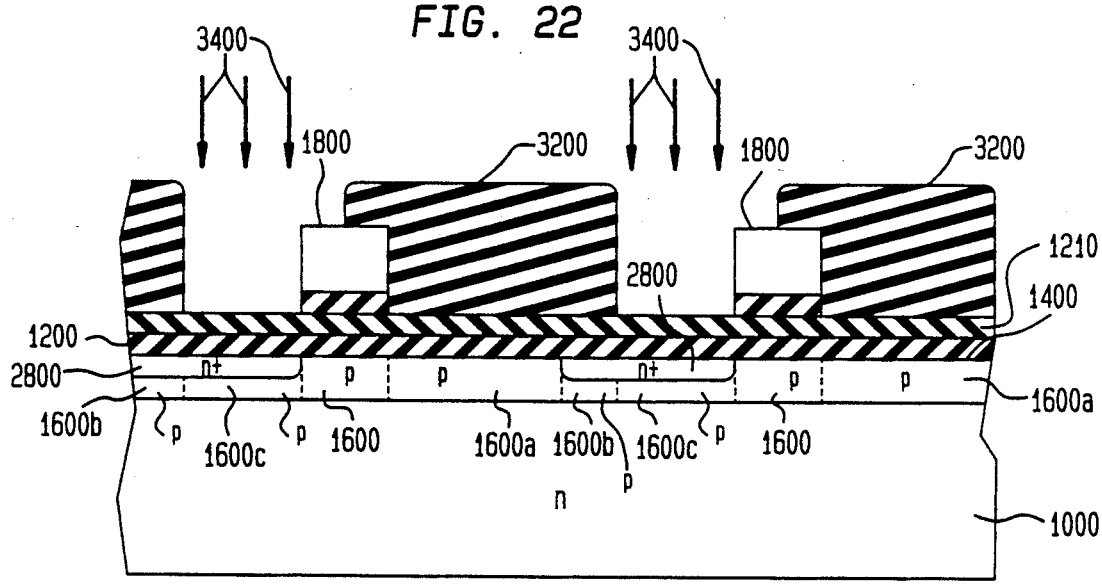

As is shown in FIG. 22, the photoresist portions 2400 are then removed with a suitable solvent and the masking regions 1800 are again enlarged to further decrease the spacing between the masking regions 1800. This is achieved by applying a layer of a photoresist 3200 over the masking regions 1800 and the exposed area of the silicon nitride layer 1210. The photoresist layer 3200 is defined, using standard photolithographic techniques, to form portions thereof which overlap one side of each of the masking regions 1800 and cover a storage region (portion 1600a) under the to be formed conductive gate 3800 (see FIG. 23) and a barrier region (portion 1600b) under each virtual gate region 2800 as is shown in FIG. 22.

As is shown in FIG. 22, ions, as indicated by the arrows 3400, of a conductivity modifier of p-type conductivity, such as boron, are then implanted into the substrate 1000 through the exposed areas of the silicon nitride layer 1210 to form portions 1600c of channel region 1600 which have a higher impurity concentration than portions 1600b. Portions 1600c establish the channel potential of a storage region under the virtual gate region 2800. The ions are preferably implanted at a dosage of $1.75 \times 10^{12}$ atoms/cm$^2$ and an energy of 100 keV.

The photoresist portions 3200 are then removed with a suitable solvent. The polycrystalline silicon masking regions 1800 and the silicon dioxide layer 1220 are then removed with suitable etchants. The polycrystalline silicon masking regions 1800 can be removed using an HF and nitric acid solution. The silicon dioxide layer 1210 can be removed using buffered HF. The silicon nitride layer 1210 is then removed, typically by the use of a solution of hot phosphoric acid and water at 170 degrees C.

Figure 23:
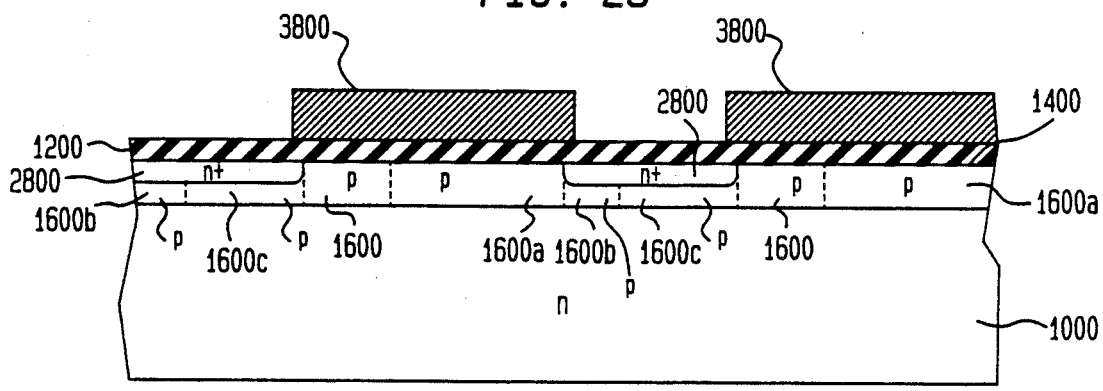

As shown in FIG. 23, a layer of phosphorous doped polycrystalline silicon is then deposited over the silicon dioxide layer 1200 and is defined to form conductive gates 3800. The conductive gates 3800 extend across the portions of the channel region 1600 and overlap portions of the virtual gates 2800. It is only necessary that conductive gates 3800 extend up to virtual gates 2800. To insure that this occurs in a non-self aligned process, it is desirable to overlap the two. During operation of the CCD, conductive gates 3800 are pulsed positive and negative to cause charge carriers to transfer (shift) from under a virtual gate region 2800 to under a conductive gate 3800.

FIG. 8, in addition to showing the electrostatic potentials of portions of the CCD of FIG. 7, also shows the corresponding potentials of the portions of the CCDs of FIGS. 15 and 23.

Thus, there is provided by the present invention a method of making a virtual phase CCD in which all of the potential regions are formed by ion implantations. This provides for good control of the concentration of the conductivity modifiers and the depth of the modifiers so as to provide the desired potential levels. In addition, only the initial implantation mask is etched and the additional masks are provided by adding regions of photoresist to the initial mask. The present method of forming a virtual phase CCD reduces the damaging effects of particles on the surface of the substrate which mask part of the ion implantations into the substrate. This is because a particle masking a portion of the width of the channel for the boron ion implantation causes an area of the silicon to have an increased potential barrier around which charge carriers can move.

It is to be understood that the embodiments of the invention which have been described are illustrative of the invention. Modifications may readily be devised by those skilled in the art without departing from the spirit and scope of the invention. For example, the sequence of steps used to form portions 16a (160a, 1600a) and 16b (160b, 1600b) can be modified. Still further, masking regions 18, 180 and 1800 can be formed from materials other than silicon dioxide and polycrystalline silicon. Still further, different materials other than photoresist can be used for photoresist layers 24, 240, 2400, 32, 320 and 3200. Still further, mask regions 18 (180, 1800), layers 24 (240, 2400) and layers 32 (320, 3200) can all be of the same material or all be of different materials. Still further, channel region 16 (160, 1600) could be formed by deposition and drive. Furthermore, conductive gates 38 (380, 3800) could be a metal such as aluminum, tungsten silicide or molybdenum or other appropriate material. When such a layer is used it can serve as a light shield over the CCD.

What is claimed is:

1. A method of making a virtual phase CCD in a semiconductor body having a major surface and being of a first conductivity type comprising the steps of:

forming a channel region of a second conductivity type which is of the opposite conductivity type of the first conductivity type in the body which extends to the major surface;

forming spaced apart masking regions above the major surface and over the channel region;

implanting ions of a second conductivity type which is of the opposite conductivity of the body between the masking regions to increase the impurity concentration of the portions of the channel region not covered by the masking regions;

increasing the size of the masking regions so as to decrease the spaces between the masking regions along the channel region;

implanting ions of the first conductivity type into the semiconductor body between the increased sized masking regions to form virtual gate regions of the first conductivity type in portions of the channel region which extend to the top surface;

implanting ions of the second conductivity type into portions of the channel region below and between the increased sized masking regions to further increase the impurity concentration of portions of the channel region below the virtual gate regions;

further increasing the size of the masking regions to further decrease the spacing between the masking regions along the channel region;

implanting ions of the second conductivity type into portions of the channel region below and between the twice increased sized masking regions to further increase the impurity concentration of portions of the channel region below the virtual gate regions;

removing the masking regions; and forming conductive gates over and insulated from the major surface between the virtual gates.

2. The method of claim 1 further comprising the step of forming an insulating layer over the major surface and forming the masking regions over the insulating layer.

3. The method of claim 2 wherein the insulating layer is silicon dioxide and the masking regions are polycrystalline which are increased in size by the addition of photoresist regions.

4. The method of claim 2 further comprising the step of forming a silicon layer over the insulating layer and forming the masking regions over the silicon layer.

5. The method of claim 4 wherein the insulating layer is silicon dioxide, the silicon layer is polycrystalline silicon and the masking regions are silicon dioxide which are increased in size by the addition of photoresist.

6. The method of claim 1 further comprising the steps of:

forming a first insulating layer over the major surface;

forming a second insulating layer over the first insulating layer;

forming a third insulating layer over the second insulating layer and forming the masking regions on the third insulating layer such that portions of the third insulating layer are covered by the masking regions; and removing portions of the third insulating layer not covered by the masking regions.

7. The method of claim 6 wherein:

the first insulating layer is silicon dioxide, the second insulating layer is silicon nitride and the third insulating layer is silicon dioxide; and the masking regions are polycrystalline silicon which are increased in size by the addition of photoresist.

8. A method of making a virtual phase CCD comprising the steps of:

forming in a semiconductor substrate of one conductivity type a channel region of the opposite conductivity type extending along a surface of the substrate;

forming spaced apart masking regions over the substrate surface spaced along the channel region;

implanting ions of a conductivity modifier of the opposite conductivity type of the substrate into the substrate along the channel region between the masking regions to increase the impurity concentration of portions of the channel region receiving the implanted ions;

increasing the size of the masking regions to decrease the dimensions of the space between the masking regions along the channel region;

implanting ions of a conductivity modifier of the opposite conductivity type into the channel region between the increased sized masking regions along the surface of the substrate to form virtual gate regions between the masking regions;

implanting ions of a conductivity modifier of the opposite conductivity type into the substrate along the channel region between the increased sized masking regions to further increase the impurity concentration of the portions of the channel region below the virtual gate regions;

further increasing the size of the masking regions to further decrease the dimensions of the space between the masking regions along the channel region;

implanting ions of a conductivity modifier of the opposite conductivity type into the substrate along the channel region between the further increased sized masking regions to still further increase the impurity concentration of portions of the channel region below the virtual gate regions;

removing the masking regions; and forming conductive gates over and insulated from the substrate surface along the areas of the channel region between the virtual gate regions.

9. The method of making a virtual phase CCD of claim 8 further comprising the step of forming a layer of silicon dioxide on the substrate surface prior to forming the channel region in the substrate and forming the masking regions on the silicon dioxide layer.

10. The method of making a virtual phase CCD of claim 9 in which the ions of the conductivity modifier of the opposite conductivity type are boron ions.

11. The method of making a virtual phase CCD of claim 10 in which the ions forming the virtual gate are arsenic ions.

12. The method of making a virtual phase CCD of claim 11 in which the masking regions are made of polycrystalline silicon.

13. The method of making a virtual phase CCD of claim 12 in which the size of the masking regions is increased by forming portions of a photoresist layer on the silicon dioxide layer which partially overlap one edge of the masking regions and which extend over a portion of the channel region between the masking regions.

14. The method of making a virtual phase CCD of claim 13 in which the channel region is formed by implanting ions of a conductivity modifier of the opposite conductivity type into the substrate.

15. The method of making a virtual phase CCD of claim 14 wherein after the masking regions are removed, the silicon dioxide layer is removed.

16. The method of making a virtual phase CCD of claim 15 wherein after the silicon dioxide layer is removed, another layer of silicon dioxide is formed on the surface of the substrate and conductive gates are formed on the other silicon dioxide layer.

17. The method of making a virtual phase CCD of claim 16 wherein the conductive gates are formed from polycrystalline silicon which is then doped with impurities.

18. A method of making a virtual phase CCD in a substrate of a semiconductor material of one conductivity type having a surface comprising the steps of:
forming a channel region of the opposite conductivity type in the substrate along said surface;
forming a layer of silicon dioxide on said surface over said channel region;
forming spaced masking regions of polycrystalline silicon on said silicon dioxide layer over and spaced along said channel region;
implanting ions of a conductivity modifier of the opposite conductivity type into the substrate between the masking regions to increase the impurity concentration of exposed portions of the channel region;
increasing the size of the masking regions so as to decrease the spaces between the masking regions along the channel region;
implanting ions of a conductivity modifier of the one conductivity type into the substrate between the increased sized masking regions to form virtual gate regions along the surface of the substrate;
implanting ions of a conductivity modifier of the opposite conductivity type into the substrate between the increased sized masking regions to further increase the impurity concentration of the exposed portions of the channel region;
further increasing the size of the masking regions to further decrease the spacing between the masking regions along the channel region;
implanting ions of a conductivity modifier of the opposite conductivity type into the substrate between the further increased sized masking regions to still further increase the impurity concentration of the exposed portions of the channel region;
removing the masking regions and the silicon dioxide layer; and
forming conductive gates over and insulated from the substrate surface between the virtual gate regions.

19. The method of making a virtual phase CCD of claim 18 in which the masking regions are increased in size by applying a layer of photoresist over the masking regions and the silicon dioxide layer between the masking regions, and defining the photoresist layer to leave portions each of which overlaps a portion of a masking region and extends over a portion of the silicon dioxide layer adjacent the masking region.

20. The method of making a virtual phase CCD of claim 19 in which the masking regions are further increased in size by removing the first portions of the photoresist, applying another layer of photoresist over the masking regions and the silicon dioxide layer between the masking regions, and defining the photoresist layer to provide portions each of which overlaps a portion of a masking region and extends over a portion of the silicon dioxide layer adjacent the masking region.

21. The method of making a virtual phase CCD of claim 20 in which the ions of a conductivity modifier of the opposite conductivity type are boron ions.

22. The method of making a virtual phase CCD of claim 21 in which the ions of a conductivity modifier for the virtual gate regions are arsenic ions.

23. The method of making a virtual phase CCD of claim 22 in which after the masking regions and silicon dioxide layer are removed, a gate silicon dioxide layer is formed over the substrate surface and gates of polycrystalline silicon are formed on the gate silicon dioxide layer.

* * * * *